(12) United States Patent
Bruno et al.

(10) Patent No.: US 12,265,812 B2
(45) Date of Patent: Apr. 1, 2025

(54) IMMUTABLE IMAGE FOR DEPLOYMENT TO EDGE DEVICES

(71) Applicant: EMC IP Holding Company LLC, Hopkinton, MA (US)

(72) Inventors: Eric Bruno, Shirley, NY (US); Amy N. Seibel, Newton, MA (US); Victor Fong, Medford, MA (US)

(73) Assignee: EMC IP Holding Company LLC, Hopkinton, MA (US)

(*) Notice: Subject to any disclaimer, the term of this patent is extended or adjusted under 35 U.S.C. 154(b) by 284 days.

(21) Appl. No.: 17/362,696

(22) Filed: Jun. 29, 2021

(65) Prior Publication Data

US 2022/0413825 A1 Dec. 29, 2022

(51) Int. Cl.
 *G06F 8/61* (2018.01)
 *G06F 30/20* (2020.01)

(52) U.S. Cl.
 CPC .............. *G06F 8/63* (2013.01); *G06F 30/20* (2020.01)

(58) Field of Classification Search
 None
 See application file for complete search history.

(56) References Cited

U.S. PATENT DOCUMENTS

| | | | | |
|---|---|---|---|---|
| 9,203,829 B1* | 12/2015 | Levine | ..................... | G06F 21/41 |
| 2006/0173993 A1* | 8/2006 | Henseler | .................... | G06F 8/63 |
| | | | | 709/224 |
| 2006/0174238 A1* | 8/2006 | Henseler | ................... | G06F 8/63 |
| | | | | 717/168 |
| 2006/0265702 A1* | 11/2006 | Isaacson | ................... | G06F 8/61 |
| | | | | 717/168 |
| 2006/0265706 A1* | 11/2006 | Isaacson | ................... | G06F 8/61 |
| | | | | 717/174 |
| 2007/0165856 A1* | 7/2007 | Sylla | ....................... | G07F 17/32 |
| | | | | 380/232 |
| 2009/0083404 A1* | 3/2009 | Lenzmeier | .............. | G06F 15/16 |
| | | | | 709/221 |
| 2013/0104232 A1* | 4/2013 | Johnson | ................ | H04W 12/12 |
| | | | | 726/23 |
| 2013/0247020 A1* | 9/2013 | Fontignie | ................ | G06F 8/654 |
| | | | | 717/168 |
| 2014/0223423 A1* | 8/2014 | Alsina | ..................... | H04L 67/34 |
| | | | | 717/173 |
| 2014/0344936 A1* | 11/2014 | Thario | ................ | G06F 3/04817 |
| | | | | 726/25 |
| 2015/0281124 A1* | 10/2015 | Zhao | ....................... | H04L 69/40 |
| | | | | 709/226 |
| 2016/0147529 A1* | 5/2016 | Coleman | ................... | G06F 8/71 |
| | | | | 717/120 |
| 2016/0378439 A1* | 12/2016 | Straub | ...................... | G06F 8/61 |
| | | | | 717/107 |
| 2017/0060556 A1* | 3/2017 | Nigul | ....................... | G06F 8/65 |

(Continued)

*Primary Examiner* — Qing Chen
(74) *Attorney, Agent, or Firm* — Workman Nydegger

(57) ABSTRACT

One example method includes creating an image definition file, using the image definition file to create an image that is deployable to an edge device, copying an agent into the image, stripping any user passwords out of the image, and removing any unnecessary packages from the image, and after the stripping and the removing, the image becomes an immutable image. The immutable image may then be deployed to a group of edge devices, and one or more layers of the immutable image may be updated by the agent.

20 Claims, 3 Drawing Sheets

(56) References Cited

U.S. PATENT DOCUMENTS

| | | | | |
|---|---|---|---|---|
| 2018/0129479 A1* | 5/2018 | McPherson | ............... | G06F 8/63 |
| 2019/0155591 A1* | 5/2019 | Kumar | ................... | G06F 11/34 |
| 2020/0150940 A1* | 5/2020 | Li | ........................... | G06F 8/443 |
| 2020/0150953 A1* | 5/2020 | Smith | ....................... | G06F 8/75 |
| 2020/0285504 A1* | 9/2020 | Siegmund | ................ | G06T 1/00 |
| 2021/0064412 A1* | 3/2021 | Yamaguchi | ......... | G06F 9/45558 |
| 2022/0244976 A1* | 8/2022 | Pal | ....................... | H04L 67/141 |

* cited by examiner

IMMUTABLE IMAGE FOR DEPLOYMENT TO EDGE DEVICES

FIELD OF THE INVENTION

Embodiments of the present invention generally relate to provisioning, deployment, and management, of edge devices. More particularly, at least some embodiments of the invention relate to systems, hardware, software, computer-readable media, and methods to develop and manage edge devices for immutability and continuous deployment.

BACKGROUND

Edge devices such as sensors, cameras, and other Internet of Things (IoT) devices are often deployed in remote, constrained, insecure, or hostile, environments. This has led to some problems with the development, deployment, and maintenance of the edge devices.

One of such problems concerns the development edge device images. Particularly, programming edge devices involves not only the client application, but also the execution environment, including runtime, middleware, and driver, for example. Conventional approaches to this problem are not developer friendly and force developers to perform manual operations in many cases.

Another problem with the development, deployment, and maintenance of edge devices is that it is difficult and impractical to implement edge devices that are immutable and support continuous deployment. Although it may be possible to manually configure edge devices as single-purposed and immutable by removing all possible logins, such an approach would make continuous deployment difficult.

A further problem concerns the size of the edge device image. For example, many well-defined Linux distributions for edge devices, such as Ubuntu Core and Raspian for example, contain a lot of general-purpose packages. At runtime however, these packages are often not needed. Moreover, these packages not only waste space on the edge device, but they also increase the potential attack surface of the edge device since the edge device may be employed in a remote and hostile environment that is not within the control of developers and administrators. Note that a hostile environment may comprise physical environmental conditions that may threaten the operation and integrity of an edge device, as well as bad actors such as hackers, who may pose a threat to the operation and integrity of the edge device.

Still another problem concerns the fact that edge device images are relatively large and expensive to transmit at runtime. In more detail, many edge devices have limited storage and bandwidth. Downloading updates at the edge device consumes a significant portion of the limited resources of the edge device, such as computation cycles, storage and bandwidth. This problem worsens when new versions of device images come bundled as one single file.

A final example of problems that occur with the development, deployment, and maintenance of edge devices concerns a container runtime environment. Typical edge device images may take the form of a container or container image. In order to execute a container, the device operating system requires, at a minimum, a container runtime such as cgroups. This requirement might not be feasible for some devices and, for single purpose devices, may not be necessary.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings.

DETAILED DESCRIPTION OF SOME EXAMPLE EMBODIMENTS

Figure 1:
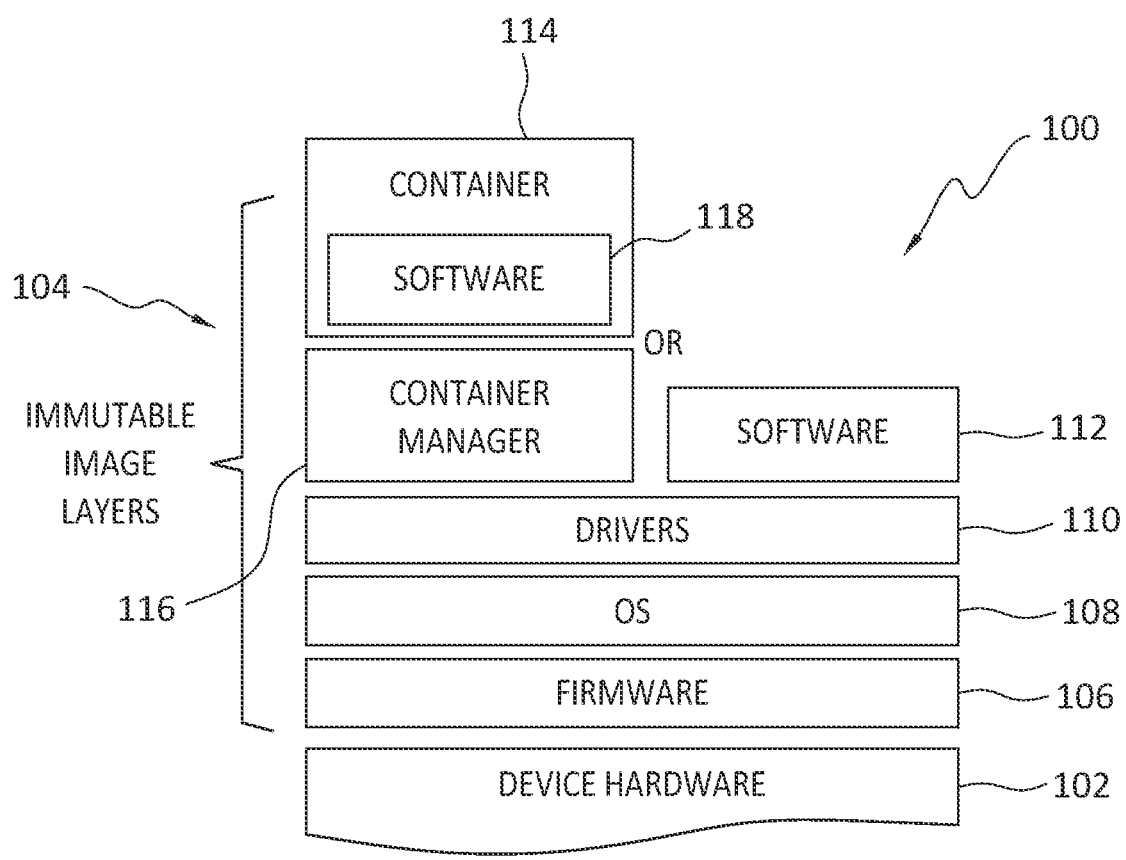
FIG. 1 discloses aspects of an image according to some example embodiments.

Embodiments of the present invention generally relate to provisioning, deployment, and management, of edge devices. More particularly, at least some embodiments of the invention relate to systems, hardware, software, computer-readable media, and methods to develop and manage edge devices for immutability and continuous deployment.

In general, example embodiments of the invention may provide development methodologies utilizing tools around a layered filesystem, as well as an immutable environment and continuous delivery for edge devices. At least some embodiments of the invention may be particularly well suited for edge devices, such as IoT devices for example, that are running a Linux-based OS, although the scope of the invention is not limited to the use of a Linux-based OS.

In view of the difficulties with developing and managing edge devices, example embodiments may provide a mechanism for utilizing a layered filesystem, providing a "Docker-like" containerized developer experience to develop and manage edge devices, including even deeply embedded, constrained, or small footprint, devices. Furthermore, example embodiments may also provide support for immutability at the end devices, as well as continuous deployment to make managing and upgrading edge devices easier.

Note that as used herein, 'immutability' includes the idea that edge devices may be configured and deployed in such a way as to prevent modification to the edge device except by an agent residing on the device itself. For example, the edge device may be configured so that no one can log into the edge device. The edge device may be immutable both before and after deployment. By virtue of its immutability, the edge device may remain static and uncompromised.

Further, as used herein, 'continuous deployment' includes the fact that an agent on the edge device may periodically, and automatically, check for updates to the various layers of the device image, and then download only the updated layers. That is, the edge device may be continuously updated/upgraded by the agent.

In some embodiments, the configuration and deployment of an edge device may proceed as follows. Initially, an Image Definition File (IDF) may be created, such as by a developer, that includes a list of commands which, when executed in order, build an image. In this respect, at least, the IDF may be similar to a 'Dockerfile.' Thus, the IDF may contain one or more commands, or lines of executable instructions. An interface, such as a command line interface (CLI) for example, may then be invoked to build an image by executing the instructions in the IDF.

In some embodiments, a base image defined by the IDF may comprise, for example, an operating system (OS) which may be Linux-based, one or more drivers, and firmware. Thus, embodiments of the invention may provide for images that may be deployed, and operate, in a bare metal device, that is, a device that lacks even basic components, such as the aforementioned OS, drivers, and firmware.

Various components may be added to the image that was created by execution of the instructions in the IDF. Such components may include, for example, files, applications, and filesystems. As well, various commands and environment-related variables of the image may be set. After these operations have been completed, the image may comprise a layered device image with a full operating system. In some embodiments, such a completed image may comprise a layered structure, such as a layered filesystem for example.

After the full image has been created, an agent may be copied into the image, passwords stripped out to prevent any entity from logging into the image, and all unnecessary packages removed from the image. The result of these processes may be a finalized image that is immutable and configured for continuous deployment. The finalized image may then be ready for registration, testing, and deployment.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

For example, one embodiment may provide for creation of an image to bare metal devices. As another example, and embodiment may provide for images that are relatively light weight and include only necessary components. In an embodiment, an immutable image may be created and deployed. As well, in an embodiment, an image may be continuously updated by an agent resident on the device where the image is deployed. As a final example, an embodiment may provide for image deployment to large numbers of edge devices, which may number, for example, in the thousands or tens of thousands. Various other advantages of some example embodiments are disclosed elsewhere herein.

A. Overview

As noted elsewhere herein, developing and managing edge devices may be difficult. Accordingly, example embodiments may offer a mechanism for utilizing a layered filesystem, providing a "Docker-like" developer experience to develop and manage edge devices, and may also provide support for immutability at the end devices, as well as continuous deployment to make managing and upgrading edge devices easier. By way of background, DevOps engineers throughout the industry are getting more used to infrastructure as code and layered-filesystem-like user experience, partly due to the popularity of container image creation developer-experience. Most container image management systems utilize layered filesystems. Developers typically provides a "Dockerfile"-like script, which may be referred to as an "Image Definition File" (IDF). Each command and setting inside the IDF may be executed in a simulated environment, for example, VM for buildx, and chroot for same kernel/architecture type. Following is a brief discussion of some conventional solutions to problems noted herein, as well as various standards, and gaps in structure, operation, and functionality, of conventional approaches.

To illustrate, the Manufacturer Usage Description (MUD) Standard (RFC 8520) states that "The goal of MUD is to provide a means for end devices to signal to the network what sort of access and network functionality they require to properly function." In contrast with embodiments of the invention however, MUD does not handle or address the development, upgrade, nor management, of the end devices.

Further, container management systems, such as Docker for example, provide for the management of container images and runtime of container. At runtime, operating system level support, that is, cgroup, needs to be part of the runtime, and the containers will be executed in container runtime environment. However, in contrast with example embodiments of the invention, Docker does not provide immutable device support, nor bare-metal support. As to the latter, the Docker base images lack a kernel, typically because the Docker containers share the kernel of the host, so the base images do not require kernels. As well, such base images also lack other essential components for deployment of the image on a stand-alone bare-metal system.

With regard to VM (Virtual Machine) image management systems, most VM image execution systems do not offer layered-filesystems such as those implemented in some example embodiments. As such, DevOps engineers typically need to go into an emulated environment, such as a VM, and then take a snapshot of the storage. This type of solution, that is, the creation and management of the snapshots, is very difficult to track.

As well, there are various conventional IaC (Infrastructure-as-Code) System solutions that would take a script to provision and continuously monitor the edge devices. Unlike example embodiments of the invention however, these IaC solutions typically require a vendor-specific API, and also do not offer an immutable infrastructure DevOps experience.

Finally, with respect to conventional Container-as-VM Systems, there are existing approaches that can execute a container image as a VM. These approaches typically work in a hypervisor environment with a thin layer of OS. Unlike example embodiments of the invention however, these approaches do not provide continuous deployment capabilities when the devices are out in the field.

B. Aspects of Some Example Embodiments of the Invention

In general, example embodiments of the invention may be directed to a development and CICD (Continuous Integration/Continuous Delivery) platform for edge devices, examples of which include, but are not limited to, IoT devices. At least some example embodiments may include any or all of the various components discussed below.

B.1 Example Components of Some Embodiments

To illustrate, some example embodiments may comprise a device simulation VM. The device simulation VM may be used, for example, for cross-compiling and development purposes, and to test the operation of an image. Example embodiments may employ conventional approaches to device simulation, such as QEMU (https://www.qemu.org/), an open source machine emulator and virtualizer, for example.

Another component of some example embodiments is an image management tool CLI (Command Line Interface). This image management CLI may be employed by DevOps engineers to create and deploy device images.

Some example embodiments may provide for an image registry. The image registry may comprise a repository of device images that can be accessed by developers, modified, and deployed.

Further, example embodiments of the invention may provide for an update agent. The update agent may be embedded in the device, and may support continuous deployment by, for example, checking for updates to one or more of the layers of an image deployed on the device.

Finally, at least some example embodiments include an upgrade manager. In general, the upgrade manager may communicate with the update agent to push updates out to the update agent for implementation on the device where the agent is deployed.

B.2 Operational Aspects—Image Creation

The operation of some example embodiments may begin with an image compilation process. In some embodiments, and similar to existing container image management systems, a DevOps engineer may be able to define an "Image Definition File" (IDF), similar to a "Dockerfile." The base images that may be used in example embodiments, however, may be different from Docker base images which typically lack a kernel and essential runtime components.

After completion of the IDF, the DevOps engineer may invoke a CLI to build the image using the instructions in the IDF. Depending the architecture type of targeted devices, a device simulation VM may be invoked if the targeted device does not have the same architecture type of the machine that built the image. In particular, the CLI, in response to user input, may build the image by executing each line of instructions in the IDF. The CLI may also capture any differences between the building device and the targeted device in a layered filesystem, possibly in a manner similar to that employed in conventional image building approaches, such as those used in the Docker platform.

The image that has been created with the CLI may be supplemented with files, and applications, and, as well, various commands and environment variables may be set in the image. The result of this process may be a layered device image with a full operating system.

After completion of the image, the CLI may then perform various actions. One action may be to copy the agent into the image, and strip out passwords for all users, so that no user can log into the edge device. As well, another action may be the removal, by the CLI, of any unnecessary packages that provide unneeded capabilities or functionalities. The removal of unnecessary packages may be automated by evaluating the package dependency tree of the client application, and then removing, for example, only packages that do not have a dependency relation with other packages. As well, utilities like SSH, compilers, and unnecessary runtime, may be removed by the CLI as well. After the CLI has performed actions such as those just described, the image may be in a state where it is immutable, and includes only packages necessary to carry out the functions of the device where the image will be deployed. The image may now be ready to be pushed to image registry, deployed to Device Simulation VM for testing purpose, or deployed to edge devices for testing or production usage. These processes are described in further detail in the discussion of FIG. 2 below.

With reference now to FIG. 1, aspects of an example device 100 with a deployed device image are disclosed. As indicated there, the device 100 may include various hardware 102 necessary to carry out the functions of the device. Such hardware 102 may include, for example, processors, communication hardware, memory, storage, sensors, cameras, and/or any other components that may be employed by an edge device, such as an IoT device for example.

In addition to the hardware 102, the example device 100 may include an image 104 comprising various immutable image layers. In general, the device hardware may perform various operations as directed by one or more layers of the image 104. The immutable layers of the image 104 may comprise a firmware layer 106, an operating system (OS) layer 108, and one or more driver layers 110. In some embodiments, the OS layer 108 may comprise a Linux-based OS, although that is not necessarily required.

It is noted that the example image 104 differs materially from, for example, conventional images such as Docker images, at least in that in the example image 104, one, some or all, of the firmware layer, OS layer, and driver layers, are immutable. In a Docker image, on the other hand, such layers are not immutable because there is typically a need, in the case of Docker and other conventional images, to be able to modify the firmware layer, OS layer, and driver layers, and/or because devices with Docker images are not typically deployed in environments where immutability is needed or desirable.

As further indicated in FIG. 1, example embodiments may provide some flexibility insofar as they may operate with, or without, containers. Specifically, the example image 104 may comprise, for example, software 112 that is executable to perform one or more functions of the device 100. Alternatively, the example image 104 may be configured for container-based operations and, as such, may comprise one or more containers 114, and a container manager 116. The container 114 may comprise software 118 that is executable to perform one or more functions of the device 100.

In some embodiments, an encryption-at-rest option to local storage of the device 100 may be implemented. For example, part or all of the image 104 may be encrypted while the device 100 is non-operational. This approach may help to prevent attackers, at the site where the device 100 is located, from physically extracting and modifying the content of locked-down devices and/or tiers.

B.3 Operational Aspects—Image Deployment

Figure 2:
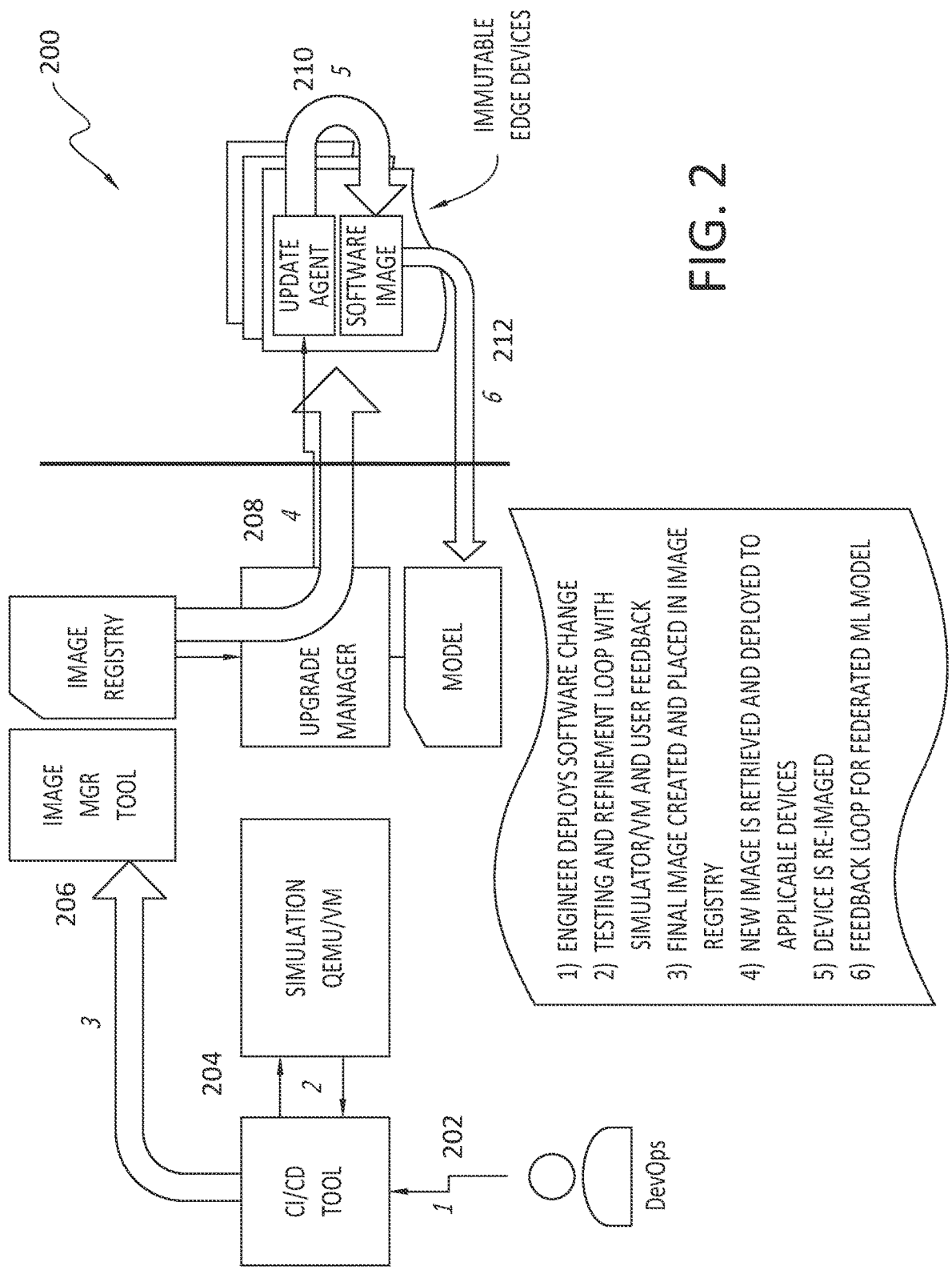
FIG. 2 discloses aspects of a method for creating and deploying an image to one or more immutable devices, with feedback sent to the deployer.

With attention now to FIG. 2, details are provided concerning an example method 200 according to some example embodiments. The method may begin at 202 where a developer deploys software, or a change to software, that is to be incorporated in a new or existing image. The deployment of the software/change 202 may be performed using a CI/CD tool.

In connection with the deployment of the software/change 202, a testing and refinement process 204 may be performed. The testing and refinement process 204 may be performed, for example, using a simulator/VM and user feedback. The testing and refinement process 204 may serve to help identify and resolve any problems with the software before the software is included in an image. After the image has been finalized, it may be placed 206 in a registry.

Once in the registry, the finalized image may be accessible by an upgrade manager which may retrieve 208 the image from the registry and deploy the image to one or more immutable edge devices. Next, the device may be re-imaged 210 to reflect the new/updated image. Where a so-called 'canary' or partial deployment model is employed, a feedback process 212 may be implemented that provides feedback concerning the operation of the deployed image. This feedback may be employed, for example, in the testing and refinement process 204.

With continued reference to the general process 200 disclosed in FIG. 2, further details are provided concerning example image deployment and continuous deployment operations.

In some embodiments, the CLI may be responsible for deploying 208 the image to many edge devices. There may be some information that may be customized for a group of individual devices. Such information may include, for example, host name, and IP address. This information may be supplied, for example, by the DevOps engineer who created the image, and handled by the CLI. When deploying a new image, an attestation snapshot may be taken, as indicated at 210 in FIG. 2.

After the image is copied to the device, which may take place while the device is turned off, the device can then be powered on and execute its client application. The agent inside the device may periodically check for updates from the image registry. When there is an update, the agent may only download the layers that are updated. This may be performed, for example, by comparing the respective hash of each existing layer with respective hashes of the updated layers, so that any unchanged layer(s) of the image can be identified and reused without re-downloading from the image registry. After the update has been performed, a checksum may be performed at each existing layer to ensure those layers have not been modified.

After downloading the updated layers, the agent may extract the layers on the storage and then apply the layers on top of one another in the image. At this point, a checksum may be performed to ensure each new layer has been successfully transmitted to the agent on the device. In some embodiments, only changed layers are transmitted, and unchanged layers are not. Since only changed layers may be LU transmitted, the bandwidth required by the device may be correspondingly reduced as compared with the bandwidth that would be needed if all the layers were transmitted to the agent. If a union filesystem is in place, the outcome may be a flattened of the outcome, that is, files that are overwritten as a result of an image update may not be needed any longer and may be deleted. The agent may then remove the old rootfs from the device. If there is local persistence storage at the device where the image is deployed, that local persistence storage may be remounted to the new rootfs. After the new rootfs is fully configured, the agent may then reboot the device for the new/updated image to take effect.

In the case where DevOps engineers need to coordinate the update for a fleet of devices in the field, the upgrade manager may be deployed, and collocated with the image registry. For example, when there is a new version of one or more image layers available, the DevOps engineers may not want all devices to upgrade, and reboot, at the same time. Thus, the upgrade manager may be used to coordinate between the upgrade time of individual devices, further providing a canary deployment model in which the updated image is deployed on a rolling or incremental basis to a fleet or group of devices.

After a new/updated image is deployed, an ongoing verification process may be employed with respect to that deployment. For example, DevOps engineers may set up periodic verifications of stack deployment, such as once a day for example, to verify that the device stack has not been modified unexpectedly. An attestation snapshot may be taken to compare with the snapshot that was taken at the deployment time. In the event that a problem is detected as a result of a comparison of the attestation snapshot with the snapshot taken at deployment, additional updates to the image be halted, and/or contingency plans could be implemented.

C. Further Discussion

As disclosed herein, example embodiments may provide various useful features and functionalities. By way of illustration, some example embodiments may implement immutability for edge devices, to help ensure that edge deployments remain static and uncompromised by physical threats and/or other threats, such as those posed by hackers and other bad actors. Such immutability may defeat attempts at intentional modification by operators and developers, and unintentional modification via hacking or other means. Embodiments of the invention may include tools to support system provisioning and deployment from the hardware layer upward, including the OS, libraries, edge application runtime components, and the application itself.

As another example, some example embodiments may provide for zero-touch deployment tools and techniques accounting for, and accommodating, immutable properties of the edge device both before and after deployment. Edge device environments bring with them unique qualities, such as their remoteness, exposure to harsh environmental factors, lack of physical security, and potentially limited bandwidth and capacity. Thus, example embodiments of the invention may implement an edge-specific deployment model that extends CI/CD tools to account for the immutable aspect of the edge devices, the need for data security and preservation, and the remaining unique edge environmental challenges.

A further aspect of some example embodiments concerns the IDF for edge devices. Particularly, some embodiments may enable developers to define an image definition file that may be used to define and configure edge devices, offering a relatively easy way to develop and maintain edge devices.

As well, some example embodiments may provide for preservation of data storage at the edge device, even during deployment and re-deployment. Particularly, at least in view of the immutable nature of the edge device, embodiments of the invention may include support for managing and preserving data that resides at the edge device to ensure nothing is lost during deployment, upgrades, or the re-provisioning of edge devices.

Example embodiments may provide for ongoing attestation verification, such as by way of the use of snapshots of the image. For example, enhanced security may be supported with attestation and trusted computing to ensure the stack, from hardware through the OS and including the application, has not been changed. In some embodiments, notifications may be provided of any abnormalities identified in the stack.

As another example, some embodiments may implement a so-called canary deployment model for an immutable edge infrastructure comprising one or more immutable edge devices. Particularly, the canary deployment model may provide for deploying an updated image, or the canary, next to a previous version of the image to see how the canary version of the image performs relative to the previous version of the image, where the previous version may be a stable, established version having known characteristics. If the canary performs acceptably, the canary version of the image may be promoted to deployment across the edge environment, which may include a fleet of immutable edge devices. If the canary version does not perform acceptably, it may be modified and then tested again, or deployment of the canary version may simply be canceled.

In a further example, some embodiments may provide for encryption at rest for an immutable infrastructure that comprises one or more immutable edge devices. For example, such embodiments may provide additional protection to the edge devices, such as by encrypting the edge device data when the edge device is powered down, to prevent a scenario in which hackers or other bad actors break open an edge device, extracting out the storage, such as a MicroSD card, and modifying the content externally. That is, even if the memory of the edge device were somehow obtained by an unauthorized party, the data in the memory may be encrypted and so would be of no use to that party.

A final example of features and functionality that may be included in some example embodiments concerns the combination of other disclosed functionalities with a federated learning process. For example, federated learning or similar techniques may be used to provide regular telemetry and other data back to the developer, even as the image itself is regularly reset. These improvements may be fed back into the simulated VM environments for reinforcement learning and improvement prior to deployment of the image. This approach may enable improvements to machine learning models that rely on data from the immutable edge devices, ranging from deployment or device monitoring to model improvements with end-user relevance. Additionally, a federated learning process may be combined with reinforcement learning, where discovered benefits from one set of devices may be applied to other immutable edge devices. This may allow for a system of automated self-improvement, where AI-based operational enhancements may be used to influence other edge devices based on key attributes.

In some alternative embodiments, an approach may be taken in which software is burned onto a read-only ROM. While this may be useful and advantageous in some respects, this approach may eliminate the ability of the edge device to be upgraded in the future.

Another alternative approach may involve creating an integrated custom, non-standard OS and application software for one-time, bespoke use on an edge device. This approach may be less than optimal in some circumstances since it lacks maintainability. However, this approach may be useful for relatively simplistic devices.

Attention is directed now to an example use case involving an immutable infrastructure such as is disclosed herein. In general, the example use case involves AI (Artificial Intelligence) powered cameras, such as video cameras for example. In more detail, an embodiment of the invention may be used to manage a fleet of immutable edge devices such as AI-powered cameras. The software for cameras may be developed according to embodiments this invention and mass manufactured. At runtime, when there is an upgrade to the AI model used for visual recognition, a new version of the image may be deployed. When there is any update to the runtime of the AI model, such as Python for example, a new image may also be deployed. The edge devices, that is, the AI-powered cameras, would only need to download and apply the updated layers without downloading the entire image again. In this way, bandwidth requirements may be minimal, and the cameras may be updated relatively quickly.

D. Example Methods

It is noted with respect to the example method of FIG. 2 that any of the disclosed processes, operations, methods, and/or any portion of any of these, may be performed in response to, as a result of, and/or based upon, the performance of any preceding process(es), methods, and/or, operations. Correspondingly, performance of one or more processes, for example, may be a predicate or trigger to subsequent performance of one or more additional processes, operations, and/or methods. Thus, for example, the various processes that may make up a method may be linked together or otherwise associated with each other by way of relations such as the examples just noted.

E. Further Example Embodiments

Following are some further example embodiments of the invention. These are presented only by way of example and are not intended to limit the scope of the invention in any way.

Embodiment 1. A method, comprising: creating an image definition file; using the image definition file to create an image that is deployable to an edge device; copying an agent into the image; stripping any user passwords out of the image; and removing any unnecessary packages from the image, wherein after the stripping and the removing, the image becomes an immutable image.

Embodiment 2. The method as recited in embodiment 1, further comprising pushing the immutable image to an image registry.

Embodiment 3. The method as recited in embodiment 2, further comprising, after the immutable image is pushed to the image registry, deploying the immutable image to a simulator and using the simulator to perform testing on the immutable image.

Embodiment 4. The method as recited in embodiment 2, further comprising, after the immutable image is pushed to the image registry, deploying the immutable to an edge device.

Embodiment 5. The method as recited in any of embodiments 1-4, wherein the agent is operable to download to the edge device only layers of the image that have been updated.

Embodiment 6. The method as recited in any of embodiments 1-5, wherein the image comprises immutable driver, OS, and firmware layers.

Embodiment 7. The method as recited in any of embodiments 1-6, wherein the image further comprises a software layer.

Embodiment 8. The method as recited in any of embodiments 1-7, further comprising performing an ongoing attestation verification to ensure that the image has not been subjected to unauthorized changes or access.

Embodiment 9. The method as recited in any of embodiments 1-8, further comprising performing an encryption at rest process for data stored at the edge device.

Embodiment 10. The method as recited in any of embodiments 1-9, further comprising preserving data at the edge device during and after an image upgrade process.

Embodiment 11. A method for performing any of the operations, methods, or processes, or any portion of any of these, disclosed herein.

Embodiment 12. A computer readable storage medium having stored therein instructions that are executable by one or more hardware processors to perform operations comprising the operations of any one or more of embodiments 1-11.

F. Example Computing Devices and Associated Media

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Figure 3:
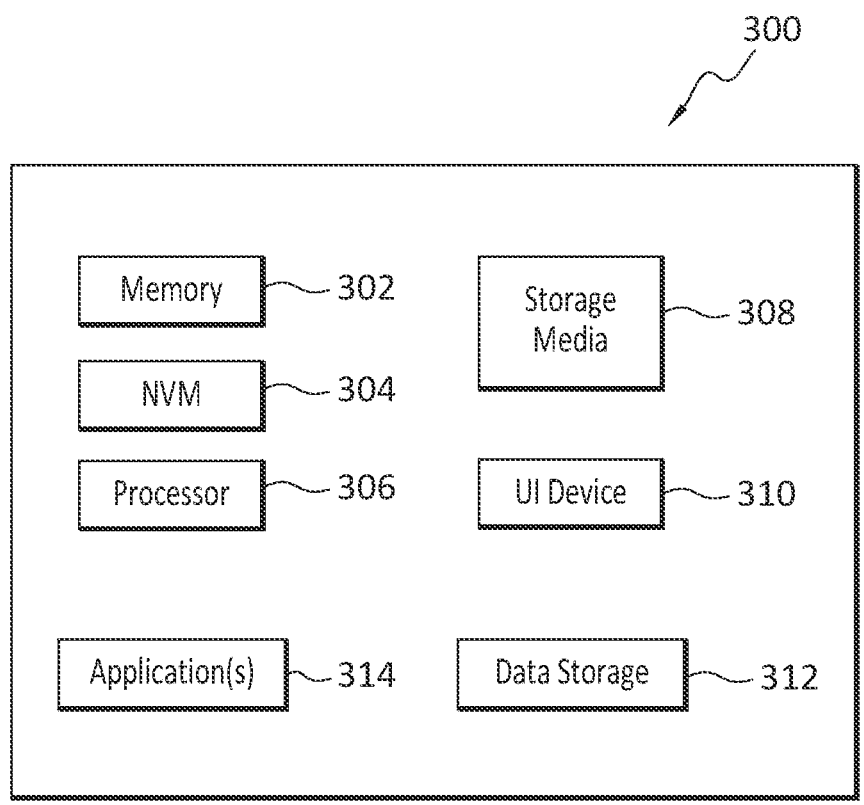
FIG. 3 discloses aspects of an example computing entity that is operable to perform any of the disclosed methods, processes, and operations.

With reference briefly now to FIG. 3, any one or more of the entities disclosed, or implied, by FIGS. 1-2 and/or elsewhere herein, may take the form of, or include, or be implemented on, or hosted by, a physical computing device, one example of which is denoted at 300. As well, where any of the aforementioned elements comprise or consist of a virtual machine (VM), that VM may constitute a virtualization of any combination of the physical components disclosed in FIG. 3.

In the example of FIG. 3, the physical computing device 300 includes a memory 302 which may include one, some, or all, of random access memory (RAM), non-volatile memory (NVM) 304 such as NVRAM for example, read-only memory (ROM), and persistent memory, one or more hardware processors 306, non-transitory storage media 308, UI device 310, and data storage 312. One or more of the memory components 302 of the physical computing device 300 may take the form of solid state device (SSD) storage. As well, one or more applications 314 may be provided that comprise instructions executable by one or more hardware processors 306 to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising operations of:

creating an image definition file;

using the image definition file to create an image that has a full operating system and is to be deployed to an edge device;

copying an agent into the image, wherein only the agent residing on the edge device is able to make modification to the edge device;

stripping all user passwords from the image so that no user can log into the edge device after all user passwords are stripped from the image; and removing any unnecessary packages, which do not have any dependency relations with other packages within the image, from the image by evaluating a package dependency tree, wherein after the stripping and the removing, the image becomes an immutable image, which is configured for continuous deployment to the edge device.

2. The method as recited in claim 1, further comprising pushing the immutable image to an image registry.

3. The method as recited in claim 2, further comprising, after the immutable image is pushed to the image registry, deploying the immutable image to a simulator and using the simulator to perform testing on the immutable image.

4. The method as recited in claim 2, further comprising, after the immutable image is pushed to the image registry, deploying the immutable image to the edge device.

5. The method as recited in claim 1, wherein the agent is operable to download, to the edge device, only layers of the image that have been updated.

6. The method as recited in claim 1, wherein the image comprises immutable driver, operating system (OS), and firmware layers.

7. The method as recited in claim 1, wherein the image comprises a software layer.

8. The method as recited in claim 1, further comprising performing an ongoing attestation verification to ensure that the image has not been subjected to unauthorized changes or access.

9. The method as recited in claim 1, further comprising performing an encryption at rest process for data stored at the edge device.

10. The method as recited in claim 1, further comprising upgrading the image using information obtained from a learning process, and preserving data at the edge device during and after the upgrading of the image.

11. A non-transitory computer readable storage medium having stored therein instructions that are executable by one or more hardware processors to perform operations comprising:

creating an image definition file;

using the image definition file to create an image that has a full operating system and is to be deployed to an edge device;

copying an agent into the image, wherein only the agent residing on the edge device is able to make modification to the edge device;

stripping all user passwords from the image so that no user can log into the edge device after all user passwords are stripped from the image; and removing any unnecessary packages, which do not have any dependency relations with other packages within the image, from the image by evaluating a package dependency tree, wherein after the stripping and the removing, the image becomes an immutable image, which is configured for continuous deployment to the edge device.

12. The non-transitory computer readable storage medium as recited in claim 11, further comprising pushing the immutable image to an image registry.

13. The non-transitory computer readable storage medium as recited in claim 12, further comprising, after the immutable image is pushed to the image registry, deploying the immutable image to a simulator and using the simulator to perform testing on the immutable image.

14. The non-transitory computer readable storage medium as recited in claim 12, further comprising, after the immutable image is pushed to the image registry, deploying the immutable image to the edge device.

15. The non-transitory computer readable storage medium as recited in claim 11, wherein the agent is operable to download, to the edge device, only layers of the image that have been updated.

16. The non-transitory computer readable storage medium as recited in claim 11, wherein the image comprises immutable driver, operating system (OS), and firmware layers.

17. The non-transitory computer readable storage medium as recited in claim 11, wherein the image comprises a software layer.

18. The non-transitory computer readable storage medium as recited in claim 11, further comprising performing an ongoing attestation verification to ensure that the image has not been subjected to unauthorized changes or access.

19. The non-transitory computer readable storage medium as recited in claim 11, further comprising performing an encryption at rest process for data stored at the edge device.

20. The non-transitory computer readable storage medium as recited in claim 11, further comprising preserving data at the edge device during and after an image upgrade process.

* * * * *